(12) United States Patent
Jung et al.

(10) Patent No.: US 7,875,979 B2
(45) Date of Patent: Jan. 25, 2011

(54) METAL LINE OF SEMICONDUCTOR DEVICE HAVING A DIFFUSION BARRIER INCLUDING CRXBY AND METHOD FOR FORMING THE SAME

(75) Inventors: Dong Ha Jung, Gyeonggi-do (KR); Seung Jin Yeom, Gyeonggi-do (KR); Baek Mann Kim, Gyeonggi-so (KR); Young Jin Lee, Gyeonggi-do (KR); Jeong Tae Kim, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/619,147

(22) Filed: Nov. 16, 2009

(65) Prior Publication Data
US 2010/0059890 A1    Mar. 11, 2010

Related U.S. Application Data

(62) Division of application No. 11/940,370, filed on Nov. 15, 2007, now Pat. No. 7,638,425.

(30) Foreign Application Priority Data
Jun. 26, 2007    (KR) ...................... 10-2007-0063251

(51) Int. Cl.
*H01L 29/40* (2006.01)
(52) U.S. Cl. ........................ 257/751; 257/221; 257/774; 257/E27.098; 257/E21.098; 257/E21.575; 257/E21.627; 257/E21.641

(58) Field of Classification Search ................. 257/774, 257/751, 211, E27.098, E21.575, E21.627, 257/E21.641
See application file for complete search history.

(56) References Cited

U.S. PATENT DOCUMENTS

| | | | |
|---|---|---|---|
| 5,414,301 A * | 5/1995 | Thomas ....................... | 257/740 |
| 6,461,675 B2 * | 10/2002 | Paranjpe et al. ............. | 427/250 |
| 2006/0163732 A1 * | 7/2006 | Cunningham ............... | 257/751 |
| 2007/0141779 A1 | 6/2007 | Abelson et al. | |
| 2008/0014746 A1 * | 1/2008 | Chikarmane et al. ........ | 438/687 |

OTHER PUBLICATIONS

USPTO OA mailed Feb. 27, 2009 for U.S. Appl. No. 11/940,370.
USPTO OA mailed May 21, 2009 for U.S. Appl. No. 11/940,370.
Orlando Auciello, et al; "Multicomponent and Multilayered Thin Films for Advanced Microtechnologies: Techniques, Fundamentals and Devices", Kluwer Academic Publishers, 1992, ISBN 0-7923-2265-7, pp. 481-482.

* cited by examiner

*Primary Examiner*—Long K Tran
(74) *Attorney, Agent, or Firm*—Ladas & Parry LLP

(57) ABSTRACT

A metal line of a semiconductor device having a diffusion barrier including $Cr_xB_y$ and a method for forming the same is described. The metal line of a semiconductor device includes an insulation layer formed on a semiconductor substrate. The insulation layer is formed having a metal line forming region. A diffusion barrier including a $Cr_xB_y$ layer is subsequently formed on the surface of the metal line forming region and the insulation layer. A metal line is finally formed to fill the metal line forming region of the insulation layer on the diffusion barrier including a $Cr_xB_y$ layer.

6 Claims, 3 Drawing Sheets

METAL LINE OF SEMICONDUCTOR DEVICE HAVING A DIFFUSION BARRIER INCLUDING CRXBY AND METHOD FOR FORMING THE SAME

CROSS-REFERENCE TO RELATED APPLICATIONS

The present application claims priority to Korean patent application number 10-2007-0063251 filed on Jun. 26, 2007, which is incorporated herein by reference in its entirety.

BACKGROUND OF THE INVENTION

The present invention relates to a metal line of a semiconductor device and a method for forming the same, and more particularly, to a metal line of a semiconductor device that can improve the characteristics of a diffusion barrier and a method for forming the same.

Generally, aluminum (Al) and tungsten (W) are primarily used as a material for the metal line of a semiconductor device due to their good electrical conductivity. Recently, researches have been made offering copper (Cu) as a next-generation material for a metal line. Copper has excellent electrical conductivity and low resistance when compared to aluminum and tungsten. Therefore, copper can solve the problems associated with RC signal delay in the semiconductor device having a high level of integration and high operating speed.

Copper cannot be easily dry-etched into a wiring pattern. As a result, a damascene process is used in order to form a metal line using copper.

In the damascene process, a metal line made of copper is formed, such that a metal line forming region is defined by etching an insulation layer. A diffusion barrier is then deposited on the surface of the metal line forming region. Then, copper is completely filled into the metal line forming region.

Here, the diffusion barrier is usually formed as a double layer of TaN/Ta. A seed copper layer is formed on the diffusion barrier through PVD (physical vapor deposition) and the metal line forming region is filled with copper through electroplating using the copper layer as a seed layer.

However, limitations exist in forming the copper layer is through PVD due to a low aspect ratio in a conventional semiconductor device below 40 nm as the size gradually decreases. Therefore, a method has been proposed that after forming a Ru layer through ALD (atomic layer deposition), a copper layer is formed through electroplating. The copper layer cannot sufficiently perform its function as a diffusion barrier however, since the TaN layer formed through ALD has a greater grain size than the TaN layer formed through PVD.

Also, the specific resistance of the TaN layer that is formed through ALD is very high to the extent of 500μΩ·cm. The increase in the resistance of the entire metal line becomes substantial due to the presence of the TaN layer.

Meanwhile, the Ru layer formed on the TaN layer grows in a columnar shape. The Ru layer has the properties of a stable material that does not materially couple with copper. However, the diffusion barrier cannot perform properly since the Ru layer grows in a columnar shape.

Accordingly, in the copper metal line using the diffusion barrier as described above, the characteristics and reliability of the Hi entire semiconductor device may be deteriorated since copper is likely to diffuse to the semiconductor substrate.

SUMMARY OF THE INVENTION

Embodiments of the present invention are directed to a is metal line of a semiconductor device that can improve the characteristics of a diffusion barrier and a method for forming the same.

Embodiments of the present invention are also directed to a metal line of a semiconductor device that can improve the characteristics of a diffusion barrier improving the characteristics and reliability of a semiconductor device and a method for forming the same.

In one embodiment of the present invention, a metal line of a semiconductor device comprises an insulation layer having a metal line forming region formed on a semiconductor substrate; a diffusion barrier including a $Cr_xB_y$ layer formed on a surface of the metal line forming region of the insulation layer; and a metal line formed on the diffusion barrier including a $Cr_xB_y$ layer to fill the metal line forming region of the insulation layer.

The metal line forming region has a trench structure or a trench and a via hole structure.

The metal line includes a copper layer.

The $Cr_xB_y$ layer has an x range of 0.8~1.2 and a y range of 1.8~2.2.

The $Cr_xB_y$ layer includes a $CrB_2$ layer.

The $CrB_2$ layer has an amorphous structure.

The metal line further comprises a metal seed layer formed of Cr between the diffusion barrier and the metal line.

In another aspect, a method for forming a metal line of a semiconductor device comprises the steps of forming an insulation layer having a metal line forming region on a semiconductor substrate; forming a diffusion barrier including a $Cr_xB_y$ layer on a surface of the metal line forming region; forming a metal layer on the diffusion barrier including a $Cr_xB_y$ layer to fill the metal line forming region; and removing the metal layer and the diffusion barrier until the insulation layer is exposed.

The metal line forming region is formed to have a trench structure or a trench and a via hole structure.

The $Cr_xB_y$ layer has an x range of 0.8~1.2 and a y range of 1.8~2.2.

The $Cr_xB_y$ layer is formed as a $CrB_2$ layer.

The $CrB_2$ layer is formed to have an amorphous structure.

The $CrB_2$ layer is formed through CVD (chemical vapor deposition) using $Cr(B_3H_8)_2$ as a source gas.

The $CrB_2$ layer is formed through CVD at a temperature of 180~400° C.

Between the step of forming the diffusion barrier and the step of forming the metal layer, the method further comprises the step of forming a metal seed layer using Cr on the diffusion barrier.

The Cr layer is formed through CVD or ALD.

The metal layer includes a copper layer.

The metal layer is formed through electroplating.

DESCRIPTION OF SPECIFIC EMBODIMENTS

In the present invention, when forming a copper metal line using a damascene process, a $Cr_xB_y$ layer, preferably, a $CrB_2$ layer, formed through CVD or ALD, is used as a diffusion barrier. A Cr layer is also formed as a seed layer for a metal line through CVD on the diffusion barrier made of the $Cr_xB_y$ layer.

In this case, in the present invention, it is possible to improve the characteristics of the diffusion barrier by maximally suppressing a copper component from diffusing to a semiconductor substrate due to the fact that the $Cr_xB_y$ layer is formed through CVD or ALD which exhibits excellent step coverage performance, since the $Cr_xB_y$ layer is formed as a thin amorphous layer and has no grain boundaries. Also, in the present invention, the characteristics of the diffusion barrier can further be improved because the $Cr_xB_y$ layer formed through CVD or ALD has a considerably low specific resistance when compared to the conventional TaN layer formed through ALD. Additionally, in the present invention, it is possible to prevent a compound having high specific resistance with respect to the $Cr_xB_y$ layer from being produced unlike the conventional Ru layer used as a seed layer, since the Cr layer is formed on the $Cr_xB_y$ layer. Hence, in the present invention, the characteristics and reliability of an entire semiconductor device can be improved.

Hereafter, specific embodiments of the present invention will be described in detail with reference to the attached drawings.

Figure 1:
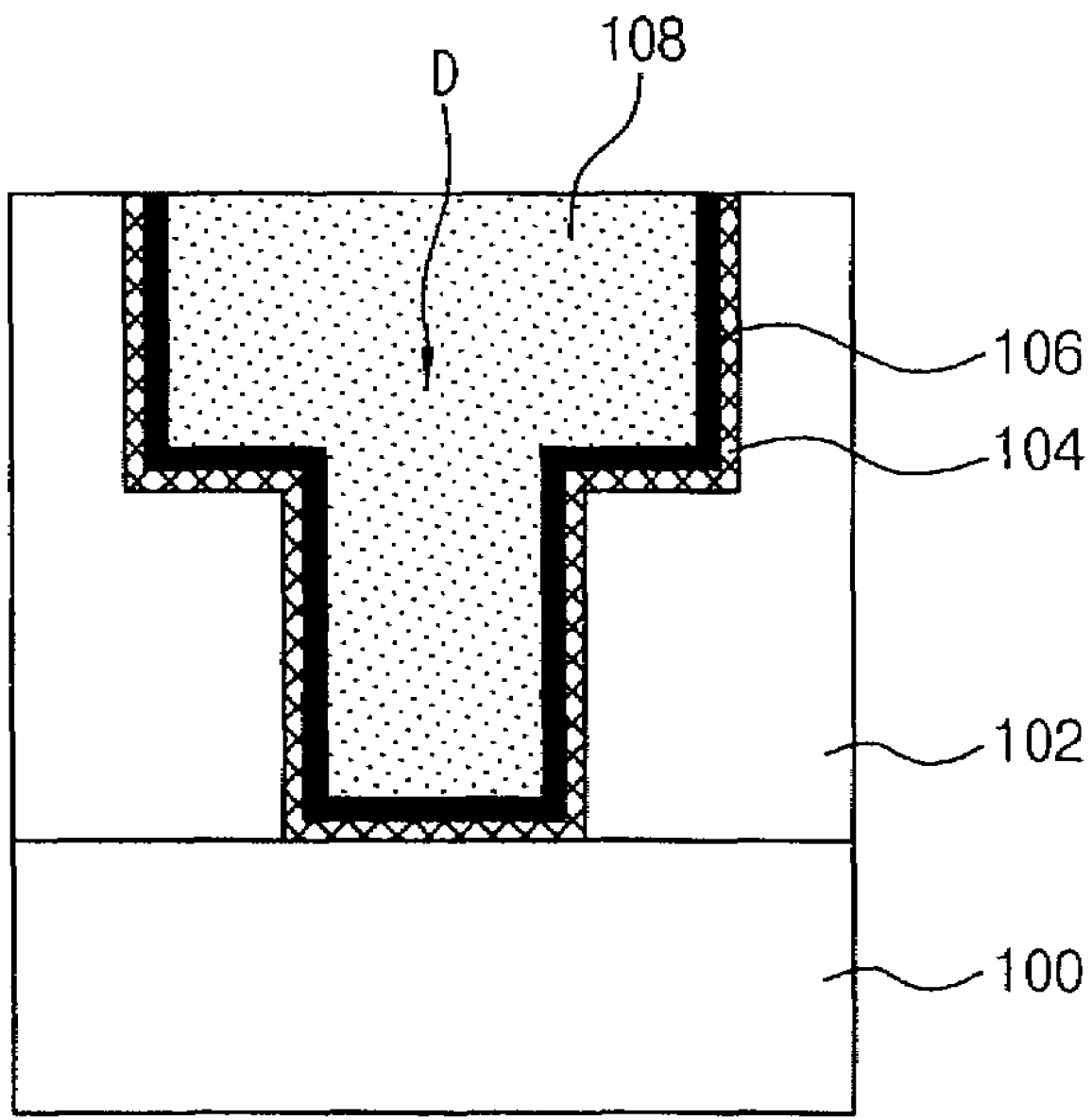
FIG. 1 is a cross-sectional view illustrating a metal line of a semiconductor device in accordance with an embodiment of the present invention.

FIG. 1 is a cross-sectional view illustrating a metal line of a semiconductor device in accordance with an embodiment of the present invention.

Referring to FIG. 1, an insulation layer 102 having a metal line forming region D is formed on a semiconductor substrate 100 having a lower structure (not shown) including gates, capacitors, etc. A diffusion barrier 104 including an amorphous $Cr_xB_y$ layer, preferably, a $CrB_2$ layer, is formed on the surface of the metal line forming region D of the insulation layer 102. A seed layer 106 made of Cr is formed on the diffusion barrier 104. A metal line 108 is subsequently formed on the diffusion barrier 104 to fill the metal line forming region D.

When the metal line forming region D is defined through a dual damascene process, the metal line forming region D has a trench and a via hole structure. When the metal line forming region D is defined through a single damascene process, the metal line forming region D has a trench only structure. The metal line 108 includes a copper layer.

In the metal line for a semiconductor device according to the present invention, the characteristics of the diffusion barrier can be improved by maximally suppressing a copper component of a copper metal line from diffusing to a semiconductor substrate since a $Cr_xB_y$ layer having no grain boundaries and made of a thin amorphous layer is formed as a diffusion barrier. Also, the characteristics and reliability of a semiconductor device can be improved because it is possible to prevent a compound having high specific resistance with respect to the $Cr_xB_y$ layer from being produced because a Cr layer is formed on the $Cr_xB_y$ layer as a seed layer.

FIGS. 2A through 2D are cross-sectional views illustrating the processes of a method for forming a metal line of a semiconductor device in accordance with another embodiment of the present invention.

Figure 2A:
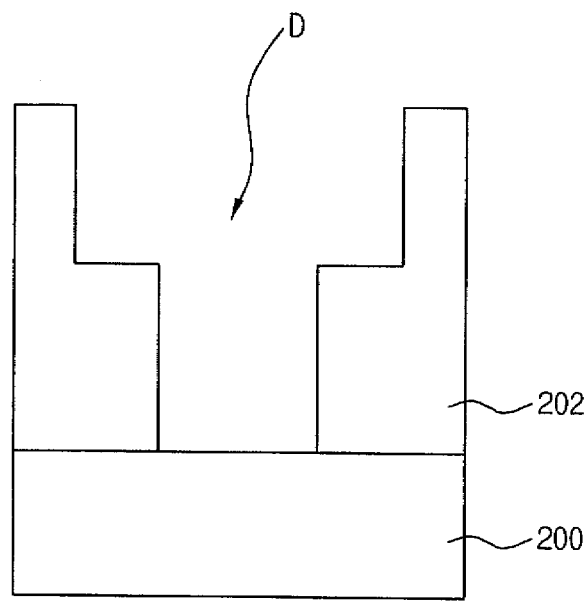
FIGS. 2A through 2D are cross-sectional views illustrating the processes of a method for forming a metal line of a semiconductor device in accordance with another embodiment of the present invention.

Referring to FIG. 2A, an insulation layer 202 is formed on a semiconductor substrate 200 that is formed with a lower structure including gates, capacitors, etc. A metal line forming region D, in which a metal line is to be formed, is defined by etching the insulation layer 202. When the metal line forming region D is is defined through a dual damascene process, the metal line forming region D has a trench and a via hole structure. When the metal line forming region D is defined through a single damascene process, the metal line forming region D has a trench only structure. For example, in the present embodiment of the invention, the metal line forming region D is formed through a dual damascene process to have a trench and a via hole structure.

Figure 2B:
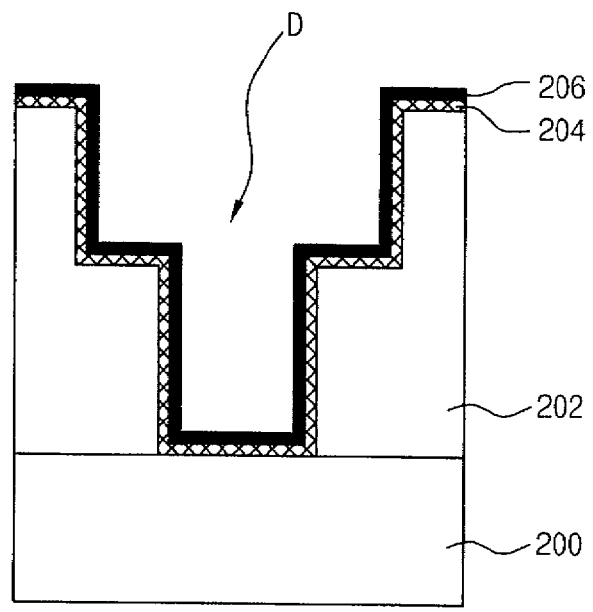

Referring to FIG. 2B, a diffusion barrier 204 including an amorphous $Cr_xB_y$ layer is formed on the surface of the metal line forming region D. In the $Cr_xB_y$ layer, x has a range of 0.8~1.2 and y has a range of 1.8~2.2. Preferably, the $Cr_xB_y$ layer is formed as a $CrB_2$ layer. A seed layer 206 made of Cr is formed on the diffusion barrier 204 including the $Cr_xB_y$ layer.

The $Cr_xB_y$ layer, preferably a $CrB_2$ layer as the diffusion barrier 204, is formed through CVD using $Cr(B_3H_8)_2$ as a source gas.

Also, the $Cr_xB_y$ layer is formed through CVD at a temperature of 180~400° C. The $Cr_xB_y$ layer has a hexagonal structure and is a highly stable compound that has a melting point of 2,200° C. Further, the $Cr_xB_y$ layer has specific resistance of 56 μΩ·cm in a bulk state and is significantly low in order to correspond to about 20% of the TaN layer (having a specific resistance of 252 μΩ·cm). Therefore, the characteristics of the diffusion barrier can be improved in the present invention.

Moreover, the $Cr_xB_y$ layer formed through a CVD process using $Cr(B_3H_8)_2$ as source gas, has an amorphous structure.

Therefore, the characteristics of the diffusion barrier can be further improved since the $Cr_xB_y$ layer having an amorphous structure has no grain boundaries, which can serve as a main cause of diffusion. Further, where the $Cr_xB_y$ layer is formed through CVD, the $Cr_xB_y$ layer has a specific resistance of 100~200 μΩ·cm depending upon a deposition temperature in spite of the fact that the $Cr_xB_y$ layer has the amorphous structure. The $Cr_xB_y$ specific resistance of 100~200 μΩ·cm is significantly low when compared to the conventional TaN layer formed through ALD.

The Cr layer as the seed layer 206 is formed through CVD or ALD. It is possible to initially prevent a compound having high specific resistance with respect to the $Cr_xB_y$ layer from being produced since the Cr layer belongs to the same type as the diffusion barrier 204 that includes the $Cr_xB_y$ layer and serves as a predeposition layer.

Meanwhile, although Cr has a specific resistance of 12.9 μΩ·cm, which is slightly greater than Ru (having a specific resistance of 7.13 μΩ·cm) used in the conventional art, the specific to resistance is sufficient to function as a seed layer for subsequent deposition of a copper layer through electroplating. The Cr layer can serve not only as the seed layer for forming the copper layer through electroplating, but can also be used effectively as the layer for preventing diffusion of Cu because Cu is not solid-solved with respect to Cr. The solid solubility of Cr with respect to Cu is very low to the extent of 0.4% or less at a temperature of 1,000° C.

Figure 2C:
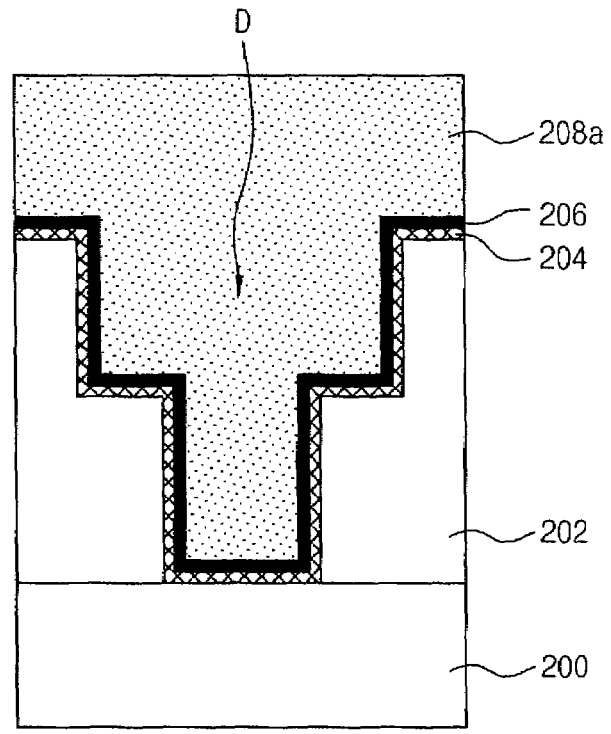

Referring to FIG. 2C, a metal layer 208a is formed on the diffusion barrier 204 including the seed layer 206 to fill the metal line forming region D. The metal layer 208a includes a copper layer.

Figure 2D:
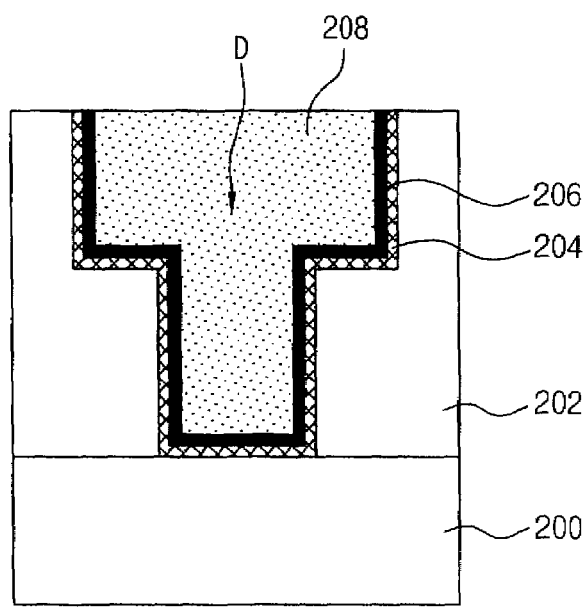

Referring to FIG. 2D, a metal line 208 of a semiconductor device according to the present invention is completed by removing the metal layer 208a and the diffusion barrier 204 including the seed layer 206 through a CMP (chemical and mechanical polishing) process until the insulation layer 202 is exposed.

As is apparent from the above description, in the present invention, the characteristics of the diffusion barrier can be improved. When forming a copper metal line using a damascene process, it is possible to maximally suppress a copper component of the copper metal line from diffusing to a semiconductor substrate because the $Cr_xB_y$ layer is formed as a diffusion barrier and a Cr layer is formed as a seed layer for a metal line through CVD or ALD that exhibits excellent step coverage performance. Also in the present invention, the characteristics of the diffusion barrier can further be improved because the $Cr_xB_y$ layer has considerably low specific resistance when compared to the conventional TaN layer formed through ALD. Additionally, in the present invention, it is possible to prevent a compound having a high specific resistance with respect to the $Cr_xB_y$ layer from being produced since the Cr layer is formed on the $Cr_xB_y$ layer. Hence, in the present invention, the characteristics and reliability of an entire semiconductor device can be improved.

Although specific embodiments of the present invention have been described for illustrative purposes, those skilled in the art will appreciate that various modifications, additions, and substitutions are possible without departing from the scope and the spirit of the invention as disclosed in the accompanying claims.

What is claimed is:

1. A metal line of a semiconductor device, comprising:
    an insulation layer formed on a semiconductor substrate, wherein the insulation layer having a metal line forming region;
    a diffusion barrier including a $Cr_xB_y$ layer formed on all surfaces of the metal line forming region of the insulation layer, wherein the $Cr_xB_y$ layer has an x range of 0.8~1.2 and a y range of 1.8~2.2; and
    a metal line formed on the diffusion barrier including a $Cr_xB_y$ layer filling the metal line forming region of the insulation layer.

2. The metal line according to claim 1, wherein the metal line forming region has a structure including a trench or a structure including a trench and a via hole.

3. The metal line according to claim 1, wherein the metal line includes a copper layer.

4. The metal line according to claim 1, wherein the $Cr_xB_y$ layer includes a $CrB_2$ layer.

5. The metal line according to claim 4, wherein the $CrB_2$ layer has an amorphous structure.

6. The metal line according to claim 1, further comprising:
    a metal seed layer formed of Cr between the diffusion barrier and the metal line.

* * * * *